United States Patent [19]

Lee et al.

[11] Patent Number: 5,627,110

[45] Date of Patent: May 6, 1997

[54] METHOD FOR ELIMINATING WINDOW MASK PROCESS IN THE FABRICATION OF A SEMICONDUCTOR WAFER WHEN CHEMICAL-MECHANICAL POLISH PLANARIZATION IS USED

[75] Inventors: Raymond T. Lee, Sunnyvale; Richard K. Klein, Mountain View, both of Calif.

[73] Assignee: Advanced Micro Devices, Inc., Sunnyvale, Calif.

[21] Appl. No.: 327,757

[22] Filed: Oct. 24, 1994

[51] Int. Cl.⁶ .................................. H01L 21/465
[52] U.S. Cl. .................. 438/692; 438/703; 438/942; 438/975
[58] Field of Search .................... 437/924, 948, 437/980, 228, 225; 148/DIG. 104–106, DIG. 102; 257/797; 156/636, 659.1; 430/5, 30, 311, 22, 317–318, 323–324

[56] References Cited

U.S. PATENT DOCUMENTS

| | | | |
|---|---|---|---|
| 4,944,836 | 7/1990 | Beyer et al. | 156/645 |
| 5,045,417 | 9/1991 | Okamoto | 430/311 |
| 5,128,283 | 7/1992 | Tamaka | 437/228 |
| 5,356,513 | 10/1994 | Burke et al. | 437/195 |

*Primary Examiner*—H. Jey Tsai
*Attorney, Agent, or Firm*—Fliesler, Dubb, Meyer & Lovejoy

[57] ABSTRACT

A method of fabricating semiconductor devices which eliminates the need to use additional window mask process to expose topographical marks, such as alignment targets, on a wafer when chemical-mechanical polish planarization technique are used to substantially planarize the surface of the wafer prior to metal deposition. The method comprises (a) depositing a first removable layer on the wafer; (b) removing a portion of the first removable layer to form a large window around the first topographical mark and to retain an area of the first removable layer around the window; (c) forming an island of material within the window and over the first topographical mark, wherein the island having a top surface of a second topographical mark replicating the first topographical mark; (d) depositing a second removable layer over the wafer including over the area and the island; (e) chemical-mechanical polishing the second removable layer to substantially planarize the second removable layer; and (f) removing the second removable layer deposited over the area and the island to expose the second topographical mark. The outer dimension of the window is large enough so that the upper surface of the second topographical mark and the upper surface of the material located in the remaining area on the wafer are of approximately equal spacing from the substantially planarized second removable layer. Accordingly, additional window mask process can be eliminated because one etch process, such as a contact etch, will be sufficient to expose the second topographical mark.

28 Claims, 7 Drawing Sheets

METHOD FOR ELIMINATING WINDOW MASK PROCESS IN THE FABRICATION OF A SEMICONDUCTOR WAFER WHEN CHEMICAL-MECHANICAL POLISH PLANARIZATION IS USED

FIELD OF THE INVENTION

The invention is generally related to photolithographic alignment of semiconductor wafers and more specifically to a method for eliminating the use of an additional window mask process in the fabrication of semiconductor wafers when a chemical-mechanical polish technique is used for planarization of the wafer surface.

BACKGROUND OF THE INVENTION

The fabrication of microcircuit devices on a semiconductor wafer involves a number of steps where patterns are transferred from photolithographic masks onto the wafer. The masking step defines selected areas to be exposed on the wafer for subsequent processes such as oxidation, etch, or impurity introduction.

In the production of integrated circuit structures, it has become increasingly important to provide structures having a plurality of metallization layers due to the ever increasing density of the circuit elements in the structure. Further, as the device and feature sizes become smaller, it is important that the photolithographic mask be aligned precisely with the wafer during the masking step to minimize the misalignment between layers. Most alignment schemes require the use of alignment targets that were defined on the wafers on the previous layers. One such scheme involves the use of a set of two alignment targets that were initially defined on the wafers, with all subsequent layers being aligned with respect to these two alignment targets. Each alignment target comprises topographical marks which can be formed by etching into the wafer a plurality of steps with a height of, for example, 1000 angstroms, and a width and a spacing between each step of, for example, 10 μm. The topographical marks of these alignment targets are used to diffract a laser alignment beam generated by a photolithography machine, commonly known as a wafer stepper, during the masking process. The diffraction pattern is detected by the wafer stepper and the relative position of the wafer and the photolithographic mask is adjusted accordingly so that the patterns from the photolithographic mask are transferred to the wafer in the precise location as desired.

During the fabrication of the integrated circuit structures, a number of metallization layers are formed. Each of the metallization layers is typically separated from another metallization layer by an insulation layer, such as an oxide layer. In order to minimize the misalignment between layers, it is important that the topography of these alignment targets be replicated from one layer to the next, since the precise registration of the resulting patterns on each successive layer are possible only if these marks are readily detectable, or "visible," to the wafer stepper during the photolithography step.

To provide an overlying metallization layer: without discontinuities or other flaws, it is desirous to provide an underlying surface for the metallization layer that is as flat or planar as possible. It has, therefore, become the practice to smooth the surface of a layer in preparation for a subsequently applied metallization layer by a process of planarization.

Conventional planarization techniques, such as plasma etching or Reactive Ion Etching (RIE) of oxides with a resist planarizing medium, are used to provide a smooth surface and a local planarization with a range of typically around 1 μm. Smoothing is achieved over a greater range, but the step topography of the alignment targets is preserved since its step spacing is much greater than the planarization range.

However, to meet the demand for more metal and insulating layers in devices and the stringent depth of focus requirement for submicron lithography, a new planarization technique, commonly known as chemical-mechanical polishing (CMP), is used. U.S. Pat. No. 4,944,836, entitled "Chem-Mech Polishing Method For Producing Coplanar Metal/Insulator Film On A Substrate" (issued Jul. 31, 1990, to Beyer et al. and assigned to International Business Machines Corporation) discloses one such CMP technique. Typically, CMP planarization of a wafer involves holding the wafer against a rotating polishing pad wet with a silica-based alkaline slurry and at the same time applying pressure. Unlike the conventional planarization techniques, the CMP planarization technique provides a substantially improved global planarization, that is, one that provides a large planarization range which is typically in the range of hundreds of μm, that is, a 2 to 3 orders of magnitude improvement over the conventional techniques. Since the planarization range is large, the alignment targets on a newly formed layer on the wafer will lose their steps after being substantially planarized by the CMP technique and thus fail to replicate the alignment targets on the previous layer that was beneath the newly formed layer. This is acceptable as long as the substantially planarized, newly formed layer is transparent, such as in the case of an oxide, since the laser alignment beam from a wafer stepper and the corresponding diffraction pattern can pass through such transparent layer. However, when a highly reflective or opaque layer, such as in the case of a metal, is deposited over the substantially planarized, newly formed layer, the alignment targets will not be visible to the wafer stepper. To avoid this situation, the topography of the alignment targets from the previous layer has to be recovered by removing the newly formed layer using a process commonly known as a "window mask" process. When this is done, a new set of alignment targets can be replicated when a newly formed metal layer is deposited.

Performed after CMP planarization and before contact masking, a window mask process is a process in which only the alignment targets are exposed, while the rest of the wafer surface is covered by photoresist. The wafer is then subjected to an oxide etch of sufficient duration so that the amount of oxide removed during this etch, plus the amount of oxide to be removed during subsequent contact etch, will expose the step patterns of the underlying alignment targets. Thus, when metal is deposited, it replicates the topography of the step patterns of the underlying alignment targets, forming a new set of alignment targets. Accordingly, the wafer stepper can now perform alignment between a photolithographic mask and the wafer in the next photolithographic process.

However, the additional window mask and etch processes, plus their attendant cleanings and inspections, undesirably increase cycle time and process complexity and also introduce particles and defects, resulting in an increase in cost and yield loss. Hence, there is a need to provide a method for preservation of the topography of alignment targets for use in a semiconductor fabrication process that utilize CMP planarization prior to metal deposition, while at the same time eliminating the additional window mask process. The present invention addresses such a need.

SUMMARY OF THE INVENTION

One aspect of the invention is to provide a method for processing a wafer with at least one topographical mark which eliminates the need to use additional window mask process when a CMP planarization technique is used prior to metal deposition.

Another aspect of the invention is to provide a method for processing a wafer with alignment targets which eliminates the need to use additional window mask process to provide replication of the alignment targets on a newly formed metal layer when a CMP planarization technique is used prior to the metal deposition.

A further aspect of the invention is to provide a method for processing a wafer with alignment targets, which minimizes cost, cycle time and yield loss by eliminating the need to use additional window mask process to provide replication of the alignment targets on a newly formed metal layer of the wafers when a CMP planarization technique is used prior to metal deposition.

Additional aspects, advantages and novel features of the invention will be set forth in part in the description which follows, and in part will become apparent to those skilled in the art upon examination of the following or may be learned by practice of the invention. The aspects and advantages of the invention may be realized and attained by means of the instrumentalities and combinations particularly pointed out in the appended claims.

In accordance with these aims and aspects, the present invention is concerned with providing a method for processing a wafer which has at least one topographical mark. The method includes (a) depositing a first removable layer on the wafer; (b) removing a portion of said first removable layer to firm a large window around said first topographical mark and to retain an area of said first removable layer around said large window; (c) forming an island of material within said window and over said first topographical mark, wherein said island having a top surface of a second topographical mark replicating said first topographical mark; (d) depositing a second removable layer over the wafer including over said area and said island; (e) chemical-mechanical polishing said second removable layer to substantially planarize said second removable layer; and (f) removing said second removable layer deposited over said area and said island to expose said second topographical mark. The outer dimension of said large window is large enough so that the vertical spacing from said substantially planarized layer of said second removable layer to the upper surface of said second topographical mark and the vertical spacing from said substantially planarized layer of said second removable layer to the upper surface of said material located in the remaining area on the wafer are approximately equal. Accordingly, an additional window mask process can be eliminated because one single etch, such as a contact etch, will be sufficient to remove said second removable layer completely from said second topographical mark so that said second topographical mark will be exposed and ready for use in the subsequent process.

By using the method of the present invention, exposure of topographical marks, including those used as alignment targets, of a semiconductor wafer can be achieved. The method eliminates the need to use additional window mask process to provide replication of alignment targets on a newly formed metal layer when a CMP planarization technique is used prior to the metal deposition. Consequently, manufacturing cost, cycle times and yield loss can be minimized.

Still other aspects and advantages of the present invention will become readily apparent to those skilled in this art from the following detailed description, wherein only the preferred embodiments of the invention have been shown and described, simply by way of illustration of the best mode contemplated by the inventors of carrying out the invention. As will be realized, the invention is capable of other and different embodiments, and its several details are capable of modifications in various obvious respects, all without departing from the invention. Accordingly, the drawings and descriptions are to be regarded as illustrative in nature, and not as restrictive.

DETAILED DESCRIPTION OF THE PREFERRED EMBODIMENTS

The following detailed description is of the best modes presently contemplated by the inventors for practicing the invention. It should be understood that the descriptions of these preferred embodiments are merely illustrative and that they should not be taken in a limiting sense.

Figure 1A:
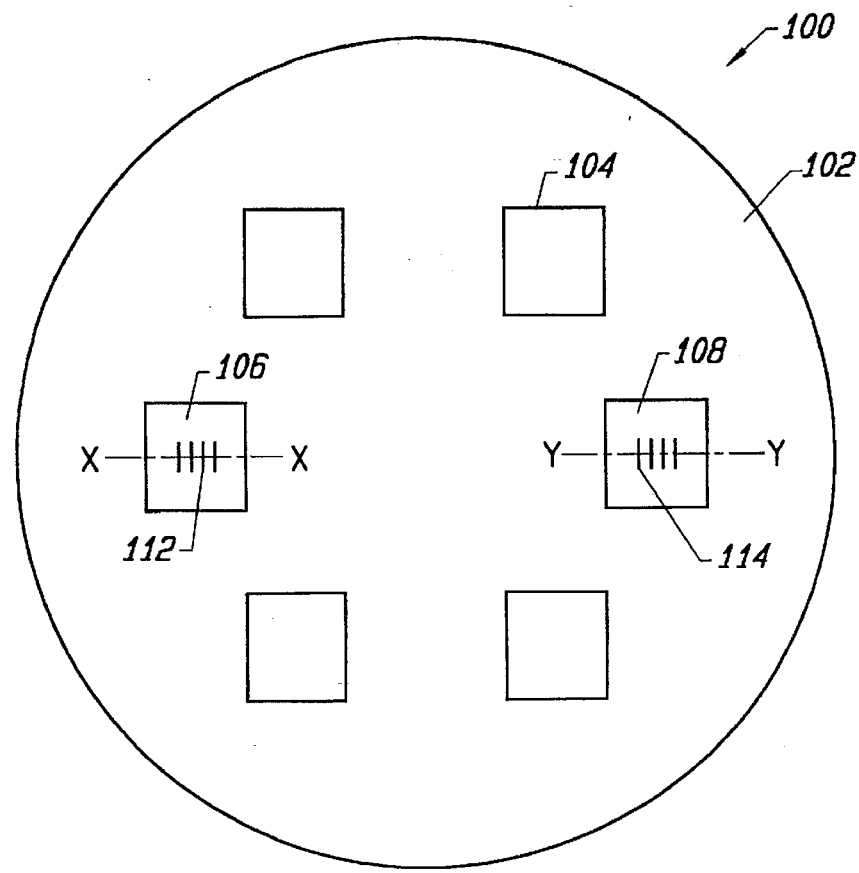
FIG. 1A is a top view of a typical semiconductor wafer showing the alignment targets and their respective locations on the wafer.

Referring to FIG. 1A, there is shown a typical semiconductor wafer 100, with a top surface 102. Semiconductor wafer 100 includes a number of circuit fields 104 and two target stepping fields, 106 and 108. Target stepping field 106 includes zero alignment target 112. Target stepping field 108 includes zero alignment target 114. Typically, zero alignment targets 112 and 114 are engraved into semiconductor wafer 100 before the formation of transistors.

Each alignment target comprises a plurality of steps arranged in a precise pattern. The pattern may comprise steps oriented in different directions. For the purpose of illustration, the pattern here only comprises steps oriented in one direction. Line X—X and Y—Y are the horizontal center line of the zero ligament targets 112 and 114, respectively. In addition, only two such steps will be shown in subsequent figures but it is understood that they are meant to represent the whole alignment target.

Figure 1B:
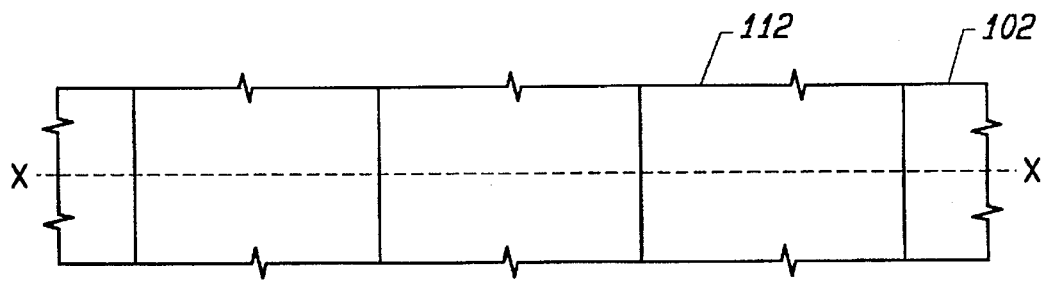
FIG. 1B is a magnified top view of a portion of one of the alignment targets shown in FIG. 1A.

FIG. 1B illustrates a magnified, top view of zero alignment target 112.

Figure 1C:
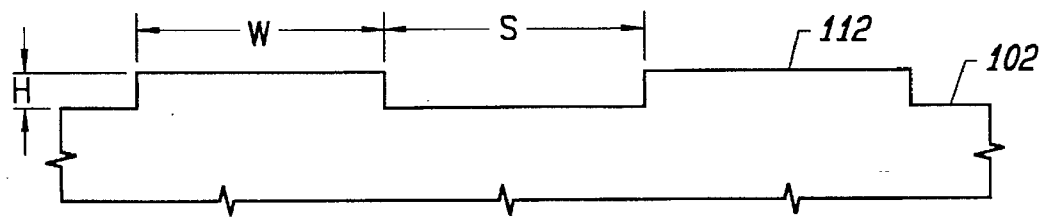
FIG. 1C is a cross-sectional view of the portion of the alignment target shown in FIG. 1B.

FIG. 1C is a cross-sectional view along line X—X of FIG. 1B. The height (H), width (W) and spacing (S) of the steps in the zero alignment target 112 are typically 1000 angstroms, 10 μm and 10 μm respectively. The steps of the zero alignment target 112 are used to diffract a laser alignment beam generated by a wafer stepper during the masking step in the photolithography process. The diffracted pattern received by the wafer stepper will direct it to make the accurate alignment between the mask and the wafer 100 so that the patterns from the mask are transferred to the wafer 100 in the precise location as desired.

Figure 2A:
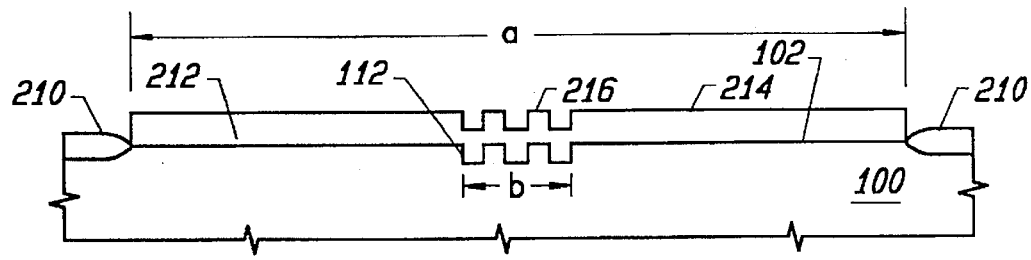
FIGS. 2A-2J are cross-sectional views of the sequence of processing steps illustrating the use of a window mask process to expose alignment targets by etching of the oxide layer before metal deposition when a CIVIP planarization step is used.

Referring now to FIG. 2A, there is shown a cross-sectional view along the horizontal center line X—X of the zero alignment target 112, formed on wafer 100, as illustrated in FIGS. 1A–B. In the related art, the width of the target stepping field 106 is in the range of 15 to 20 mm and the total length of the zero alignment target 112 is approximately 0.3 mm. A layer of field oxide 210 is grown on either side of target stepping field 106 to isolate it from surrounding circuit dies 104. A conformal layer of conductive material 212 is deposited on the top surface 102 of wafer 100. The conductive material 212 is typically polysilicon, which can be formed on wafer 100 using chemical vapor deposition. The polysilicon layer 212 includes a surface 214 and replicates the topography of the zero alignment target 112 to form first alignment target 216.

Figure 2B:
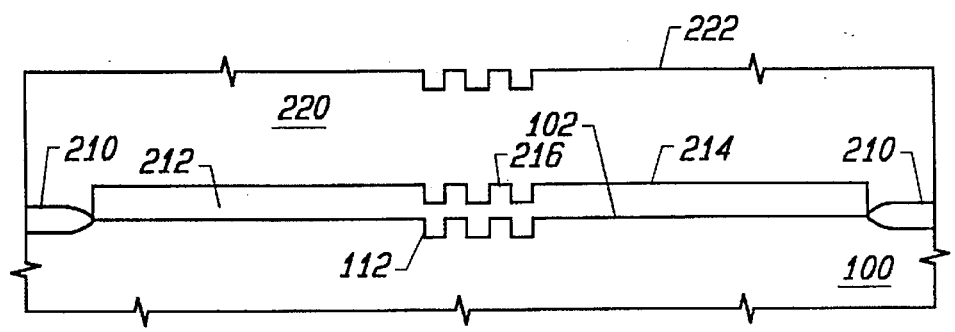

After deposition of polysilicon layer 212, a removable insulative material 220, commonly know as an inter layer dielectric, is deposited on the wafer 100 as shown in FIG. 2B. Typically, the insulative material is silicon dioxide, which can be deposited using chemical vapor deposition. Oxide layer 220 includes a surface 222.

Figure 2C:
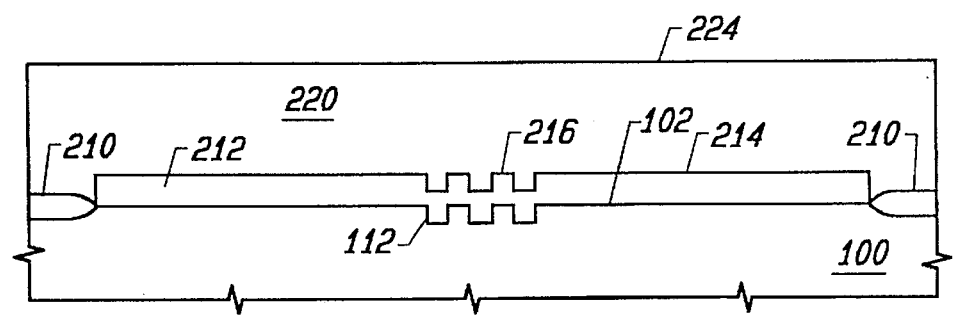

FIG. 2C shows the structure of FIG. 2B after CMP planarization. Oxide layer 220 now has a substantially planarized surface 224.

Figure 2D:
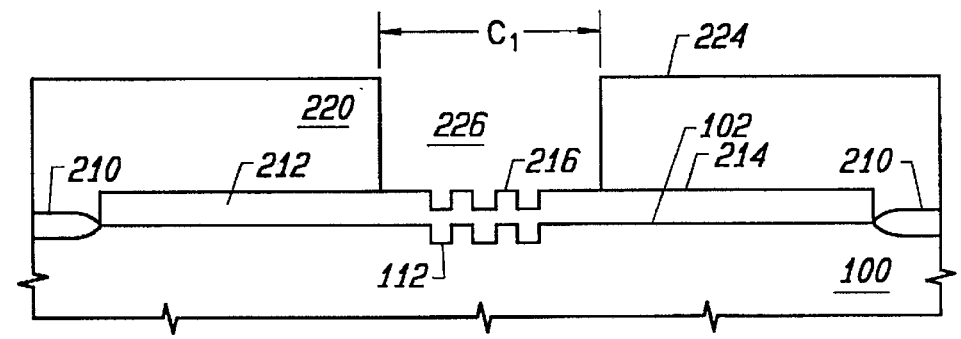

As shown in FIG. 2D, a small opening 226 is then formed on the silicon dioxide layer 220. The opening 226 has a dimension of c1, which is big enough to expose first alignment target 216. In the related art, c1 is typically 0.5 mm, which is 0.2 mm bigger than the length, b, of the first alignment target 216.

Figure 2E:
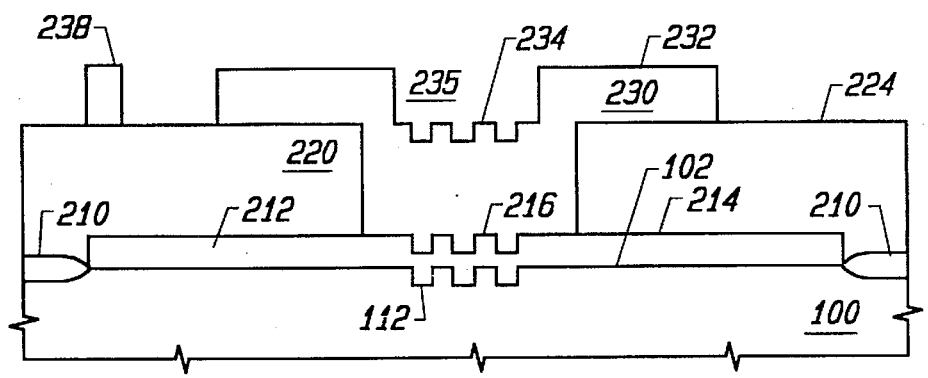

Next, a layer of conductive material 230 is deposited on the surface 224 of the wafer 100 as shown in FIG. 2E. The conductive material 230 is typically a metal, and is usually aluminum or its alloy. The metal layer 230 can be deposited on the surface 224 using a technique known as sputtering. The metal layer 230 includes a surface 232. The surface 232 replicates the topography of the first alignment target 216 to form a second alignment target 234. The surface 232 also includes a cavity 235 where the second alignment target 234 resides. The second alignment target 234 is used as an alignment target for patterning the metal layer 230 utilizing a photolithography process. By way of illustration, FIG. 2E shows a patterned conductive trace 238 on an adjacent circuit die.

Figure 2F:
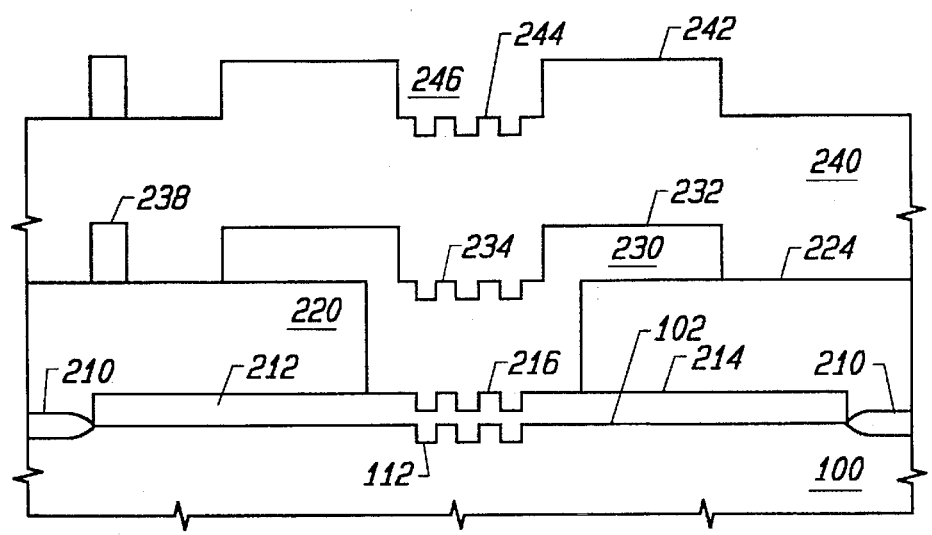

Thereafter, a removable insulative layer 240, typically formed of silicon oxide, is deposited over the metal layer 230 and the oxide layer 220 as shown in FIG. 2F. Again, the oxide layer 240 can be formed using chemical vapor deposition. The thickness of oxide layer 240 is typically around 2.5 μm. The oxide layer 240 includes a surface 242. The surface 242 generally replicates the topography of surface 232 of metal layer 230 and surface 224 of oxide layer 220. Specifically, surface 242 replicates the second alignment target 234 to form a temporary alignment target 244 which resides in an opening 246.

The dimension of the opening 246 is about the same as the opening 226, which is approximately 0.5 mm. As mentioned earlier, the width of the target stepping field 106 is in the range of 15 to 20 mm, which is much bigger than the dimension of the opening 246. Next, the whole wafer surface is polished using the CMP planarization technique.

In general, planarization is achieved by the following selective process: more material is removed from a surface that is higher relative to its surrounding, than a surface that is flat relative to its surrounding, than a surface that is lower relative to its surrounding. Since the temporary alignment target 244 resides in the opening 246 with a dimension of approximately 0.5 mm, which is comparable to the CMP planarization range, substantial planarization results. Furthermore, the temporary alignment target surface 244 is much lower than the surrounding surface 242. As a result, the CMP planarization technique will not remove much material inside the opening 246, but instead, substantially planarize the whole surface 242 by removing material from the surface 242 selectively which eventually eliminates the temporary alignment target 244.

Figure 2G:
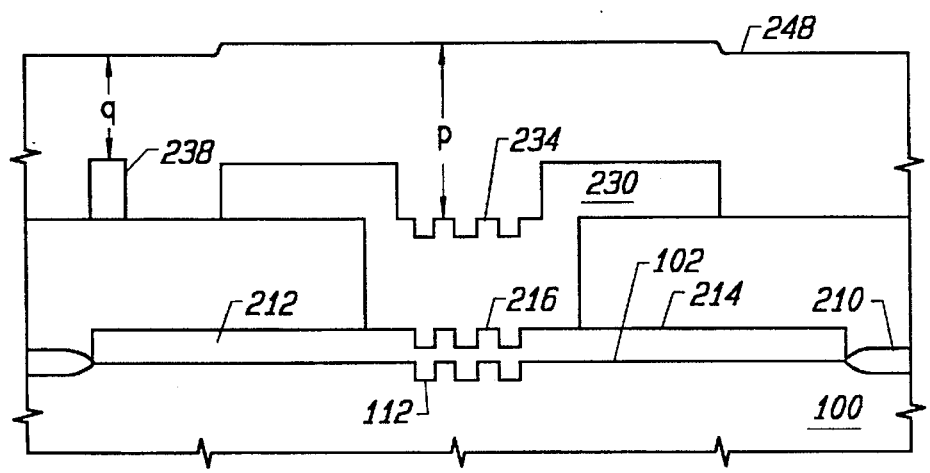

FIG. 2G illustrates wafer 100 of FIG. 2F after the CMP planarization. A new substantially planarized surface 248 is provided on the oxide layer 240. The spacing between the second alignment target 234 and surface 248 is p, whereas the spacing between the top surface of the metal trace 238 and surface 248 is q. Since the second alignment target 234 is recessed within the former opening 235 and since the CMP planarization produces a relatively flat profile across the whole surface 242, the second alignment target 234 is now at a distance of p-q, which is in the order of 0.8 μm lower than the top surface of the metal trace 238. The increased distance of p-q requires the use of the window mask process since without such window mask process, a subsequent contact etch step by etching down to the metal trace 238 will not be sufficient to remove all the oxide above the second alignment target 234.

Figure 2H:
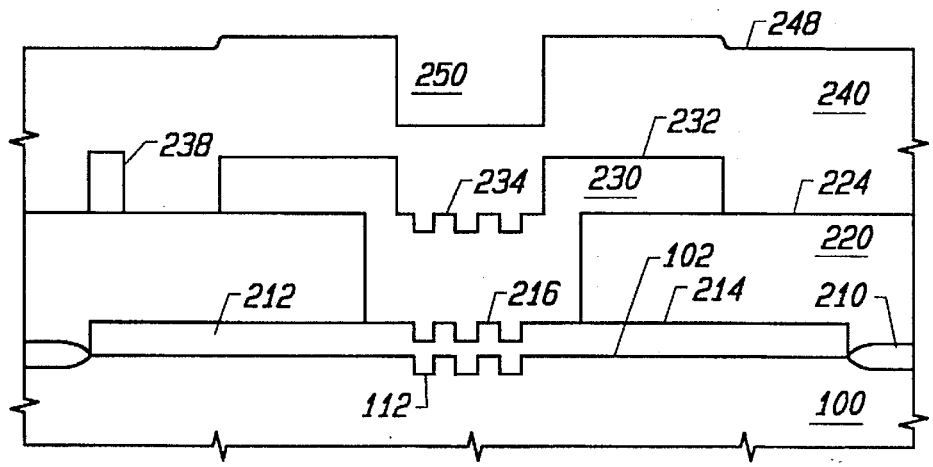

FIG. 2H illustrates the window mask process. The window mask process is one in which only the second alignment targets are exposed, while the rest of the wafer surface is covered by photoresist. The wafer is then subject to an oxide etch of sufficient duration so that the amount of oxide removed during this etch, plus the amount of oxide to be removed during subsequent contact etch, will expose the step patterns of the underlying second alignment targets. In this case, an opening 250 is etched with a depth of approximately p-q formed directly above the second alignment target 234.

Figure 2I:
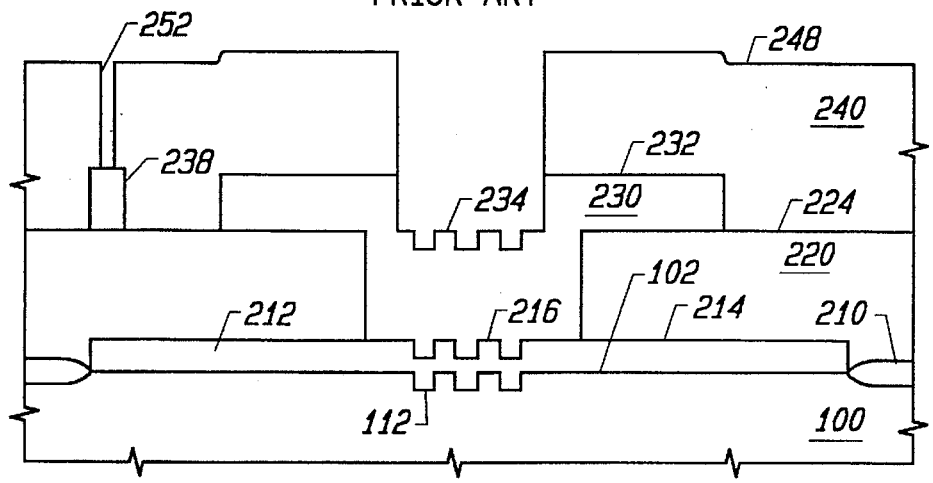

FIG. 2I illustrates the contact etch process in which contacts, or small vias, from the surface 248 are formed by etching through the oxide layer 240 to selected metal traces. In the case of metal trace 238, a via 252 is formed. At the same time, the remaining oxide 240 above the second alignment target 234 is also etched away so as to expose the second alignment target 234.

Figure 2J:
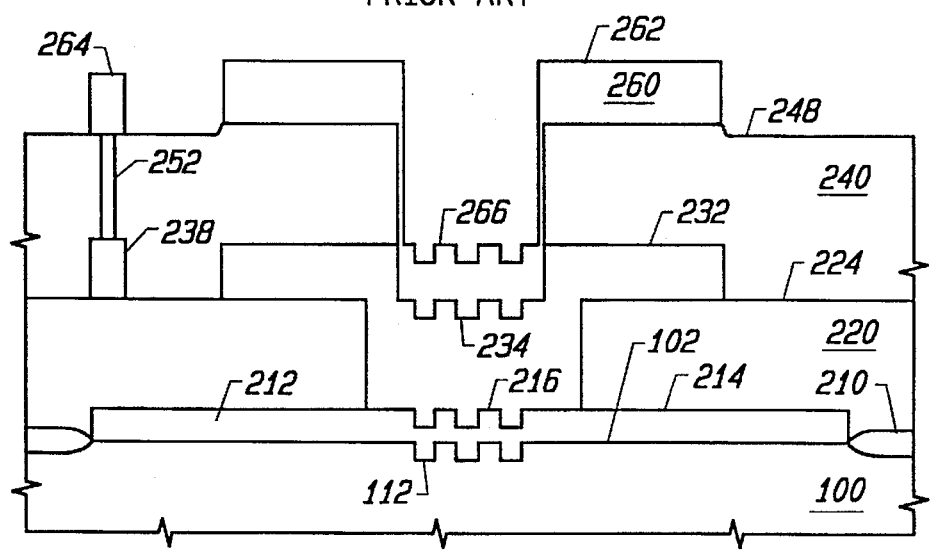

A layer of conductive material 260 is then deposited on the surface 248 of the oxide layer 240 as shown in FIG. 2J. The conductive material 260 is typically a metal, usually aluminum or its alloy. Similarly, the metal layer 260 can be deposited on the surface 248 using the sputtering technique. The metal layer 260 includes a surface 262 and replicates the topography of the second alignment target 234 to form a third alignment target 264. The third alignment target 264 can now be used as an alignment target for patterning the metal layer 260 into the desired metal pattern, such as metal trace 264, which is electrically coupled to metal trace 238 through via 252.

To form the next layer of metal, the sequence of steps as illustrated in FIGS. 2F–J are repeated. In order to preserve the alignment targets, the additional window mask process as illustrated in FIG. 2H must be used each time before the next layer of metal is formed.

However, the additional window mask and etch processes, plus their attendant cleanings and inspections, undesirably increase cycle time and process complexity and also introduce particles and defects, resulting in and increase in cost and yield loss. In addition, as the complexity of integrated circuits increases, so does the number of metal layers. The increase in the number of metal layers further magnifies the problem since the window mask process as shown in FIG. 2H has to be repeated many times for wafers with multi-layer metals in order to preserve the alignment targets. The present invention eliminates the need to use additional window mask process without adding complexity or cost to the existing wafer fabrication process.

Figure 3A:
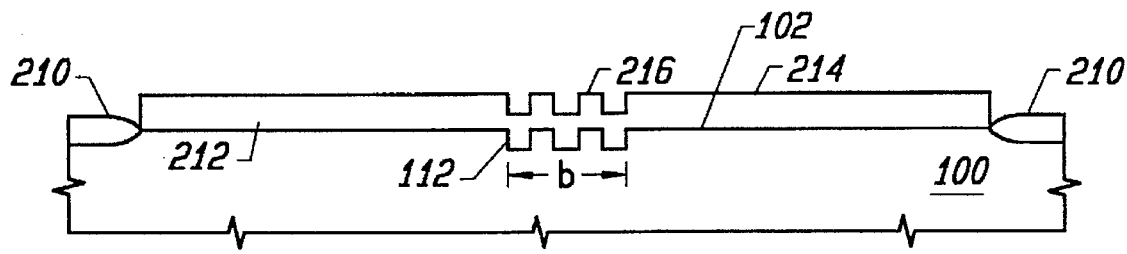
FIGS. 3A-3I are cross-sectional views of the sequence of processing steps illustrating the use of the present invention which eliminates the window mask process when a CMP planarization step is used by providing a large opening around the alignment target and an island for which the new alignment target resides It will be appreciated that these drawings are for the purposes of illustration, and are therefore not necessarily drawn to scale.
Figure 3B:
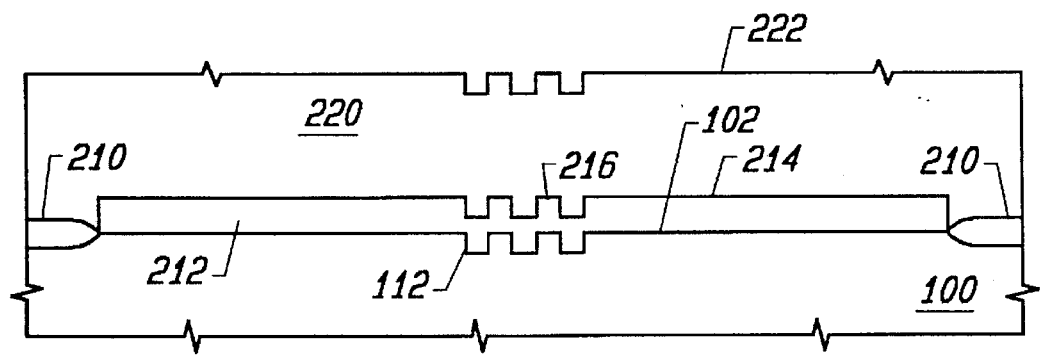
Figure 3C:
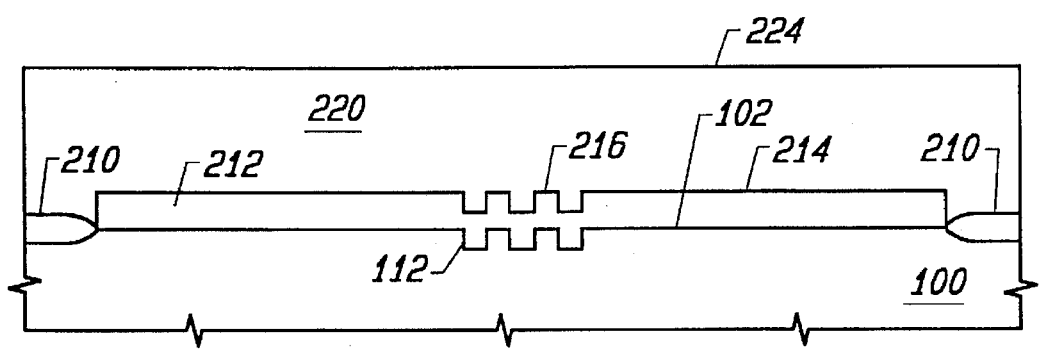

FIGS. 3A–C are identical to FIG. 2A–C, and illustrate a cross-sectional view along the horizontal center line X—X of the zero alignment target 112, formed on wafer 100, as illustrated in FIGS. 1A–B. There is shown the deposition of polysilicon layer 212 and the deposition of the oxide layer 220, followed by CMP planarization.

Figure 3D:
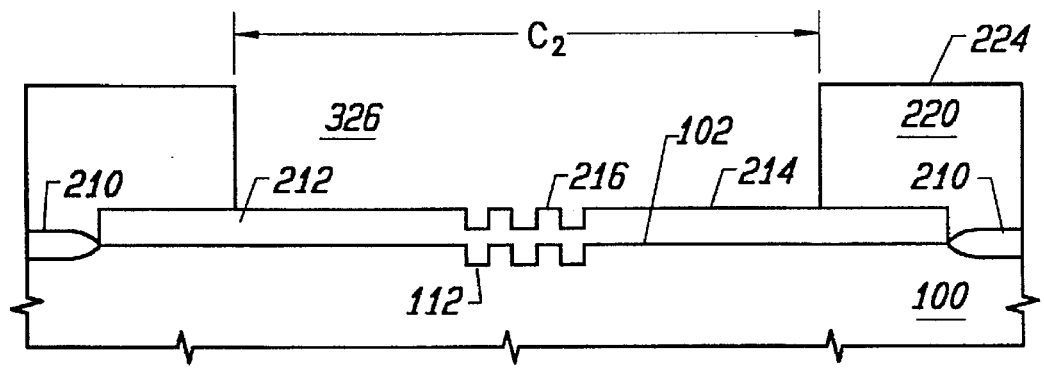

In accordance with the present invention, FIG. 3D shows that a relatively large opening 326, which is 10 to 16 times larger than the length of the zero alignment target 112, is formed on the oxide layer 220. Thus the opening 326 is large relative to the zero alignment target 112. In this embodiment, the opening 326 has a dimension of c2, which is in the range of approximately 3.5 to 5.0 mm. Opening 326 in the present invention is thus approximately 7 to 10 times larger than the opening 226 of the related art.

Figure 3E:
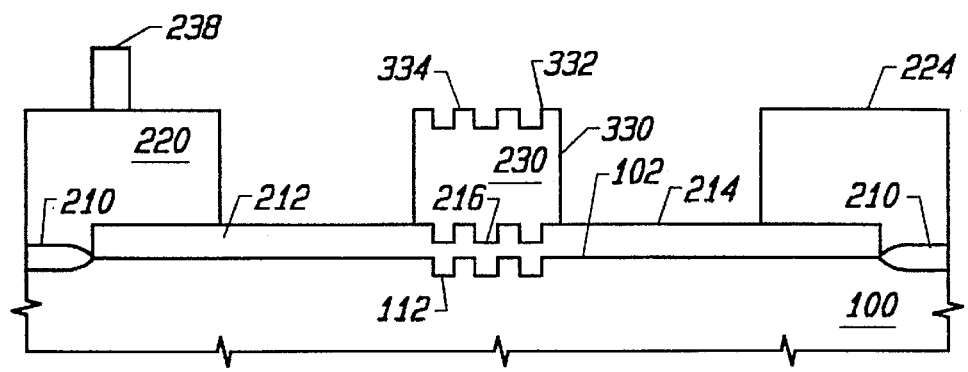

As shown in FIG. 3E, a layer of metal 22;0 is then deposited on the surface 224 of the wafer 100, followed by a patterning step using a photolithography process. The metal layer includes a surface 332 which replicates the topography of oxide layer 220 and the polysilicon layer 212. Surface 332 which is directly above the first alignment target 216 replicates the topography of the first alignment target 216 to form a second alignment target 334. The second alignment target 334 was used as an alignment target for the patterning step using a photolithographic process. An island 330 which includes the second alignment target 334 and has a width of approximately 0.5 mm is patterned on top of the first alignment target 216. Island 330 can be formed by using a special patterned mask layer which has an open frame that duplicates the size of the two target stepping fields 106 and 108. The open frame also includes a solid center portion, which has a width of approximately 0.5 mm on each side, and is in registry with the opening 326. This special patterning is done on the target stepping fields only and can be processed at the same photolithography step where the circuit dies are patterned. The solid center portion is positioned to be located directly above the first alignment target 216 so that island 330 of metal 230 remains directly above the first alignment target after the subsequent etching step. Also shown in FIG. 3 E is a patterned conductive trace 238 on an adjacent circuit die.

Figure 3F:
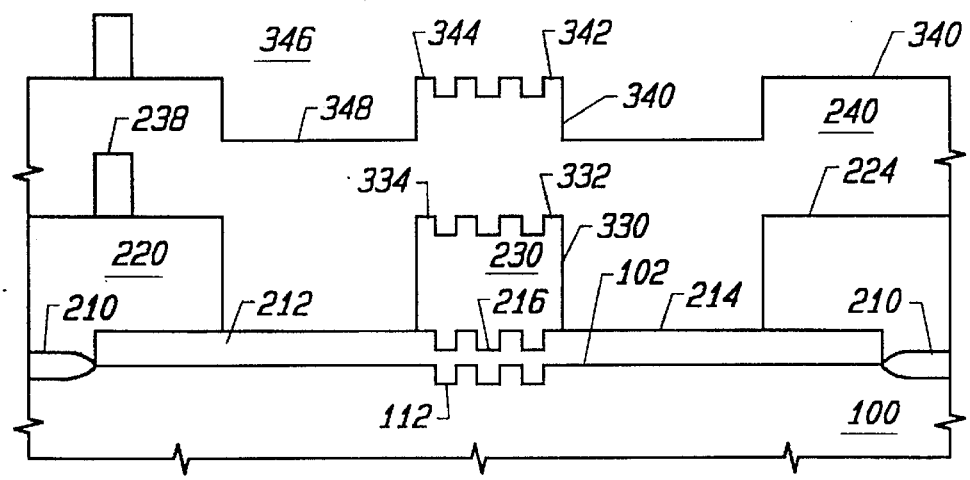

Similar to what was shown in FIG. 2F, FIG. 3F illustrates that an oxide layer 240 is then deposited over metal layer 230 and the oxide layer 220. Again, the thickness of oxide layer 240 is around 2.5 µm. The oxide layer includes a surface 340 which generally replicates the topography of the surface of metal layer 230 and surface 224 of oxide layer 220. An island 340 is formed on top of the second alignment target 334. Island 340 resides in a large opening 346. Island 340 includes a surface 342 which replicates the topography of the second alignment target 334 to form a temporary alignment target 344. The opening 346 includes a surface 348.

The outer dimension of the opening 346 is about the same as the outer dimension of opening 326, which is in the range of approximately 3.5 to 5.0 mm. Therefore, the outer dimension of the opening 346 is large compared to the CMP planarization range which is in the order of hundreds of µm. The width of the island 340 is approximately the width of the island 330, which is approximately 0.5 mm.

Figure 3G:
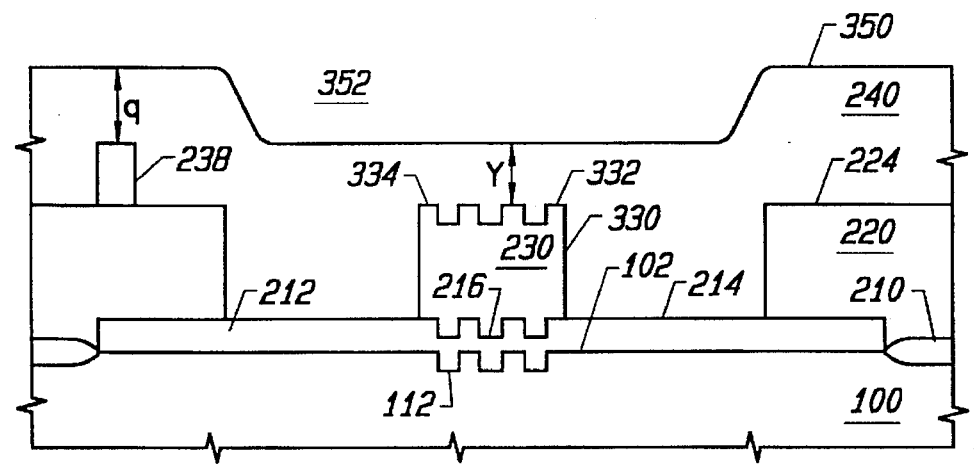
Figure 3H:
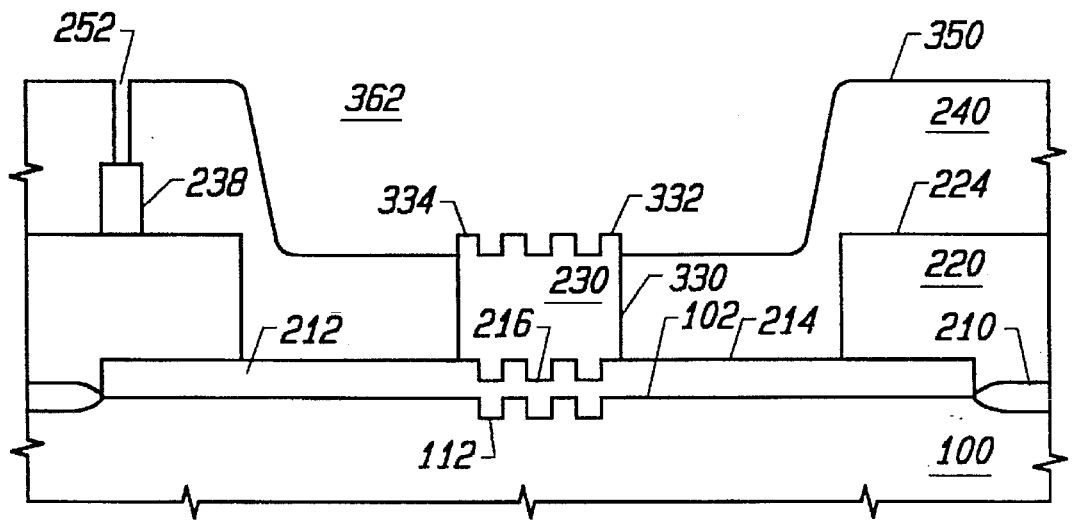

Following the same processing sequence, the wafer surface is then subjected to CMP planarization technique. As shown in FIG. 3G, a new polished surface 350 is provided on the oxide layer 240 after the CMP planarization. Because of the large dimension of the opening 346, CMP planarization is not capable of complete planarization and a depression 352 is left after CMP planarization. In contrast, the dimension of island 340 is within the CMP planarization range and a relatively flat topography results. After CMP planarization, the spacing between the second alignment target 334 and surface 350 is r, whereas the spacing between the metal trace 238 and surface 350 is q, similar to the case of the related art (FIG. 2G). In the case of the related art, however, distance p (FIG. 2G) is much larger than distance q, because of the substantially flat surface across the region containing the alignment target. In the present invention, because depression 352 (FIG. 3G) is created, distance r is much smaller than distance p, and is approximately equal to distance q. Therefore, a subsequent contact etch step as shown in FIG. 3H which is used to selectively etch oxide 240 down from surface 350 to metal patterns, such as metal trace 238 on oxide layer 224, will also remove all of the oxide 240 above the second alignment target 334, resulting in the exposure of the second alignment target 334. Thus an additional window mask process can be eliminated. The second alignment target 334 now resides in an opening 362.

Figure 3I:
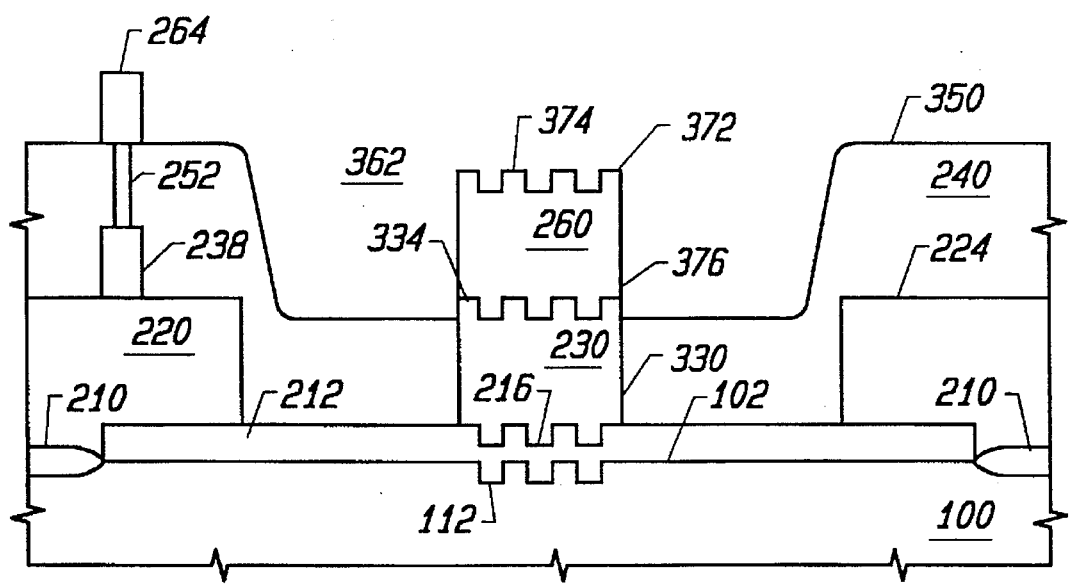

Just as what was shown in FIG. 2J of the related art a layer of metal 260 is then deposited on the surface 350 of the oxide layer 240 as shown in FIG. 3I. The metal deposition, which can be performed by sputtering, is followed by a patterning step using a photolithography process. Similar to FIG. 3E, the metal layer 260 includes a surface 372 which replicates the topography of oxide layer 240. Surface 372 which is directly above the second alignment target 334 replicates the topography of the second alignment target 334 to form a third alignment target 374. The third alignment target 374 was used as an alignment target for the photolithographic process. An island 376 which includes the third alignment target 374 and has a width of approximately 0.5 mm is patterned on top of the second alignment target 334. Also shown in FIG. 3I is a patterned metal trace 264, which is directly above, and electrical coupled to, metal trace 238, on the adjacent circuit die.

The wafer 100 is now ready for the next oxide deposition, contact etch, and metal deposition process similar to what was shown in FIGS. 3F–H to provide for the next metal layer without the need to use an additional window mask process.

Accordingly, by using the method of the present invention, exposure of topographical marks, including those used as alignment targets, of a semiconductor wafer can be achieved without having to use the window mask process when a CMP planarization technique is used prior to the metal deposition. Consequently, manufacturing cost, cycle times and yield loss can be minimized.

While it is preferable to pattern the newly formed alignment target, such as the second alignment target 334, in the form of an island, such as island 330, the present invention also works when no such island is formed.

The above described embodiments are merely illustrative of the present invention. Various alternate designs will become apparent to those skilled in the art after reading the above disclosure. For example, the present invention may be applied to preserve any topographical marks, such as those used as bar codes on a wafer, during metal deposition. Furthermore, a complete removal of all the oxide above the topographical marks or alignment targets is not necessary for this invention to work so long as the resulting topographical marks or alignment targets are detectable by a photolithography machine. Finally, it is to be understood that the scope of the invention is not limited merely to the above described embodiments.

What is claimed is:

1. A method of replicating a first topographical mark on a wafer, comprising:

(a) depositing a first removable insulative layer on the wafer;

(b) removing a portion of said first removable insulative layer to form a large window relative to and around said first topographical mark and to retain an area of said first removable insulative layer around said large window;

(c) forming an island of conductive material within said window and over said first topographical mark, said island having a top surface of a second topographical mark replicating said first topographical mark;

(d) depositing a second removable insulative layer over the wafer including over said area and said island;

(e) chemical-mechanical polishing said second removable insulative layer to planarize said second removable insularire layer; and (f) removing said second removable insulative layer deposited over said area and said island to expose said second topographical mark.

2. The method of claim 1 wherein said first removable insulative layer is composed of silicon dioxide.

3. The method of claim 1 wherein said large window has an outer dimension in the range of approximately 3.5 to 5.0 mm.

4. The method of claim 1 wherein said conductive material is aluminum or an alloy thereof.

5. The method of claim 1 wherein said second removable insulative layer is composed of silicon oxide.

6. A method of fabricating semiconductor devices on a top surface of a semiconductor wafer using photolithographic masks and without using a window mask, the semiconductor wafer including a first alignment target having a non-planar upper surface, the method comprising the steps of:

(a) forming a first layer of insulative film on the wafer, said first layer of insulative film having an upper surface;

(b) forming a first larvae opening relative to and around said first alignment target on said first layer of insulative film;

(c) forming and patterning a first layer of conductive film on said first layer of insulative film and in said first large opening, wherein said first layer of conductive film includes a first portion, said first portion residing in the first large opening so that said first portion does not contact either the upper surface of said first layer of insulative film or a portion of said first layer of conductive film that does contact the upper surface of said first layer of insulative film, said first portion having an upper surface which replicates the non-planar upper surface of said first alignment target to form a corresponding second alignment target having a non-planar upper surface;

(d) forming a second layer of insulative film on the wafer, said second layer of insulative film having an upper surface;

(e) chemical-mechanical polishing said upper surface of said second layer of insulative film to planarize said upper surface of said second layer of insulative film; and (f) removing said second layer of insulative film to expose said second alignment target.

7. The method of claim 6 wherein said first large opening has an outer dimension in the range of approximately 3.5 to 5.0 mm.

8. The method of claim 6 wherein said step of forming and patterning said first layer of conductive film comprises:

(a) depositing said first layer of conductive film on said first layer of insulative film and in said first large opening;

(b) forming a patterned mask layer over said first layer of conductive film to provide exposed and unexposed portions of said first layer of conductive film;

(c) etching exposed portions of said first layer of conductive film through said patterned mask layer; and (d) removing said patterned mask layer.

9. The method of claim 8 wherein said patterned mask layer has a second opening therein in registry with said first large opening, said second opening having an annular opening with a solid center portion, said solid center portion being positioned to be located directly above said first alignment target so that an island of said first layer of conductive film remains directly above said first alignment target after said etching step.

10. The method of claim 9 wherein said step of forming said patterned mask layer comprises depositing a patterned layer of photoresist over said first layer of conductive film.

11. The method of claim 10 wherein said first layer of conductive film is aluminum or an alloy thereof.

12. The method of claim 8 wherein the step of depositing said first layer of conductive film is achieved by sputtering.

13. The method of claim 6 wherein said first layer of insulative film is a silicon dioxide.

14. The method of claim 6 wherein said second layer of insulative film is a silicon oxide.

15. The method of claim 6 wherein said steps of forming said first layer of insulative film and said second layer of insulative film are achieved by chemical vapor deposition.

16. A method of fabricating semiconductor devices on a top surface of a semiconductor wafer using photolithographic masks and without using a window mask, the semiconductor wafer including a first alignment target having a non-planar upper surface, the method comprising the steps of:

(a) forming a first layer of insulative film on the wafer, said first layer of insulative film having an upper surface;

(b) forming a first large opening relative to and around said first alignment target on said first layer of insulative film;

(c) depositing a first layer of conductive film on said first layer of insulative film and in said first large opening, wherein said first layer of conductive film includes a first portion, said first portion residing in said first large opening, said first portion having an upper surface which replicates the non-planar upper surface of said first alignment target to form a corresponding second alignment target having a non-planar upper surface;

(d) forming a patterned mask layer over said first layer of conductive film by depositing a layer of photoresist over said first layer of conductive film to provide exposed and unexposed portions of said first layer of conductive film;

(e) etching exposed portions of said first layer of conductive film through said patterned mask layer so that the first portion of said first layer of conductive film does not contact either the upper surface of said first layer of insulative film or a portion of said first layer of conductive film that does contact the upper surface of said first layer of insulative film;

(f) removing said patterned mask layer;

(g) forming a second layer of insulative film on the wafer, said second layer of insulative film having an upper surface;

(h) chemical-mechanical polishing said upper surface of said second layer of insulative film to planarize said upper surface of said second layer of insulative film; and (i) removing said second layer of insulative film to expose said second alignment target.

17. The method of claim 16 wherein said first large opening has an outer dimension in the range of approximately 3.5 to 5.0 mm.

18. The method of claim 16 wherein said patterned mask layer has a second opening therein in registry with said first large opening, said second opening having an annular opening with a solid center portion, said solid center portion being positioned to be located directly above said first alignment target so that an island of said first layer of conductive film remains directly above said first alignment target after said etching step.

19. The method of claim 18 wherein said first layer of conductive film is aluminum or an alloy thereof.

20. The method of claim 16 wherein the step of depositing said first layer of conductive film is achieved by sputtering.

21. The method of claim 16 wherein said first layer of insulative film and said second layer of insulative film are silicon oxide.

22. The method of claim 16 wherein said steps of forming said first layer of insulative film and said second layer of insulative film are achieved by chemical vapor deposition.

23. A method of fabricating semiconductor devices on a top surface of a semiconductor wafer using photolithographic masks and without using a window mask, the semiconductor wafer including a plurality of first alignment targets, each of the first alignment targets having a non-planar upper surface, the method comprising the steps of:

(a) forming a first layer of insulative film on the wafer;

(b) forming a plurality of first large openings, wherein each first large opening in the plurality of first large openings is formed relative to and around a corresponding one of the plurality of first alignment targets on said first layer of insulative film;

(c) depositing a first layer of conductive film on said first layer of insulative film and in said plurality of first large openings, wherein said first layer of conductive film includes a first portion, said first portion residing in said plurality of first large openings, said first portion having an upper surface which replicates the non-planar upper surface of each of the first alignment targets in said plurality of first alignment targets to form a corresponding plurality of second alignment targets, each second alignment target having a non-planar upper surface;

(d) forming a patterned mask layer over said first layer of conductive film by depositing a layer of photoresist over said first layer of conductive film to provide exposed and unexposed portions of said first layer of conductive film, wherein said patterned mask layer has a plurality of second openings therein in registry with said plurality of first large openings, each one of said plurality of second openings having an annular opening with solid center portions, said solid center portions being positioned to be located directly above a corresponding one of said plurality of first alignment targets;

(e) etching exposed portions of said first layer of conductive film through said patterned mask layer so that an island of said first layer of conductive film remains directly above each of the first alignment targets in said plurality of first alignment targets;

(f) removing said patterned mask layer;

(g) forming a second layer of insulative film on the wafer, said second layer of insulative film having an upper surface;

(h) chemical-mechanical polishing said upper surface of said second layer of insulative film to planarize said upper surface of said second layer of insulative film; and (i) removing said second layer of insulative film to expose said plurality of second alignment targets.

24. The method of claim 23 wherein each of said first large openings has an outer dimension in the range of approximately 3.5 to 5.0 mm.

25. The method of claim 23 wherein said first layer of conductive film is aluminum or an alloy thereof.

26. The method of claim 23 wherein the step of depositing said first layer of conductive film is achieved by sputtering.

27. The method of claim 23 wherein said first layer of insulative film and said second layer of insulative film are silicon oxide.

28. The method of claim 23 wherein said steps of forming said first layer of insulative film and said second layer of insulative film are achieved by chemical vapor deposition.

* * * * *

UNITED STATES PATENT AND TRADEMARK OFFICE
CERTIFICATE OF CORRECTION

PATENT NO. : 5,627,110
DATED : 5/6/97
INVENTOR(S) : Lee et al.

It is certified that error appears in the above-indentified patent and that said Letters Patent is hereby corrected as shown below:

Column 1, line 59, please delete ":".

Column 3, line 34, please delete "firm" and insert therefor -- form--.

Column 4, line 26, please delete "CIVIP" and insert therefor --CMP--.

Column 7, line 33, please delete "22;0" and insert therefor --230--.

Column 9, line 57, please delete "larvae" and insert therefor --large--.

In the Abstract, line 11, please delete ":".

Signed and Sealed this

Sixth Day of January, 1998

Attest:

BRUCE LEHMAN

Attesting Officer      Commissioner of Patents and Trademarks